(12) United States Patent
Yamada et al.

(10) Patent No.: US 12,398,456 B2
(45) Date of Patent: Aug. 26, 2025

(54) TRANSPARENT CONDUCTIVE FILM, LAMINATE, AND METHOD FOR PRODUCING TRANSPARENT CONDUCTIVE FILM

(71) Applicant: NITTO DENKO CORPORATION, Ibaraki (JP)

(72) Inventors: Kyotaro Yamada, Osaka (JP);
Toshihiro Tsurusawa, Osaka (JP);
Hironobu Machinaga, Osaka (JP);
Motoki Haishi, Osaka (JP); Eri Ueda, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 162 days.

(21) Appl. No.: 17/764,909

(22) PCT Filed: Sep. 16, 2020

(86) PCT No.: PCT/JP2020/035129
§ 371 (c)(1),
(2) Date: Mar. 29, 2022

(87) PCT Pub. No.: WO2021/065519
PCT Pub. Date: Apr. 8, 2021

(65) Prior Publication Data
US 2022/0341024 A1 Oct. 27, 2022

(30) Foreign Application Priority Data
Sep. 30, 2019 (JP) .................. 2019-179479

(51) Int. Cl.
C23C 14/08 (2006.01)
C23C 14/58 (2006.01)
(52) U.S. Cl.
CPC ........ *C23C 14/086* (2013.01); *C23C 14/5806* (2013.01)
(58) Field of Classification Search
None
See application file for complete search history.

(56) References Cited

U.S. PATENT DOCUMENTS

2001/0037935 A1  11/2001  Oya et al.
2009/0202747 A1*  8/2009  Yukinobu ............ H10K 77/111
                                                                 427/369
2011/0100801 A1  5/2011  Hasegawa
(Continued)

FOREIGN PATENT DOCUMENTS

JP  H05-151827 A  6/1993
JP  2002-163932 A  6/2002
(Continued)

OTHER PUBLICATIONS

Translation—JP2003261326A , Hirai T , Sep. 16, 2003 (Year: 2003).*

(Continued)

*Primary Examiner* — David Sample
(74) *Attorney, Agent, or Firm* — WHDA, LLP

(57) ABSTRACT

A transparent conductive film (3) includes a polycrystal (31). The polycrystal (31) has grains (32). The grains (32) have an average value Df of a maximum Feret diameter of 160 to 400 nm.

5 Claims, 4 Drawing Sheets

(56) References Cited

U.S. PATENT DOCUMENTS

| | | | | |
|---|---|---|---|---|
| 2011/0177314 | A1* | 7/2011 | Tatami | H01B 1/08 |
| | | | | 428/220 |
| 2016/0300632 | A1 | 10/2016 | Kawakami et al. | |
| 2018/0113526 | A1* | 4/2018 | Tatami | G06F 3/041 |
| 2020/0214089 | A1* | 7/2020 | Tsurusawa | H05B 3/84 |

FOREIGN PATENT DOCUMENTS

| | | | | |
|---|---|---|---|---|
| JP | 2003261326 | A | * | 9/2003 |
| JP | 2007046081 | A | * | 2/2007 |
| JP | 2014-201800 | A | | 10/2014 |
| WO | 2009/157571 | A1 | | 12/2009 |
| WO | 2015/178298 | A1 | | 11/2015 |
| WO | 2019/027048 | A1 | | 2/2019 |
| WO | WO-2019027049 | A1 | * | 2/2019 ............ B32B 27/08 |

OTHER PUBLICATIONS

Translation—JP-2007046081-A—Kawamura K, Feb. 22, 2007 (Year: 2007).*
Origin of characteristic grain-subgrain structure of tin-doped indium oxide films, Masayuki Kamei *, Yuzo Shigesato, Satoru Takaki; Thin Solid Films 259 (1995) 38-45 Sep. 28, 1994 (Year: 1994).*
International Search Report dated Dec. 1, 2020, issued in counterpart International application No. PCT/JP2020/035129. (4 pages).
Office Action dated Aug. 6, 2024, issued in counterpart JP Application No. 2021-550589, with English translation. (9 pages).
Office Action dated Jan. 22, 2025, issued in counterpart CN Application No. 202080066587.X, with English translation. (16 pages).

* cited by examiner

TRANSPARENT CONDUCTIVE FILM, LAMINATE, AND METHOD FOR PRODUCING TRANSPARENT CONDUCTIVE FILM

TECHNICAL FIELD

The present invention relates to a transparent conductive film, a laminate, and a method for producing a transparent conductive film.

BACKGROUND ART

There have been conventionally known transparent conductive films in a polycrystalline state. Polycrystalline transparent conductive films have conventionally been known.

For example, Patent Literature 1 describes a conductor-equipped substrate. The conductor-equipped substrate includes a transparent conductive film having a necessary portion on which a metal coating is formed. The transparent conductive film is a film having a crystal grain size of 400 Å or more in the <222> direction by the X-ray diffraction method. This allows to obtain a strong adhesion strength between the transparent conductive film and the metal coating. In addition, the transparent conductive film is polycrystalline.

On the other hand, a technique for preventing deterioration of a transparent conductive layer by a gas barrier layer has been known. For example, Patent Literature 2 describes a transparent conductive film including a resin substrate, a gas barrier layer, and a transparent conductive layer. In the transparent conductive film, the gas barrier layer is formed between the resin substrate and the transparent conductive layer. The gas barrier layer suppresses transmission of water vapor to prevent deterioration of the transparent conductive layer. The transparent conductive film for example has a water vapor transmission rate of 0.1 g/m$^2$/day or less under high humidity conditions at 40° C. and 90% RH.

CITATION LIST

Patent Literature

Patent Literature 1: JP H5-151827 A
Patent Literature 2: JP 2014-201800 A

SUMMARY OF INVENTION

Technical Problem

According to the technique described in Patent Literature 1, the crystal grain size of the transparent conductive film in the <222> direction by the X-ray diffraction method is defined from the viewpoint of enhancing the adhesion strength between the transparent conductive film and the metal coating. In Patent Literature 1, no study has been made on the durability of the transparent conductive film in a high temperature and high humidity environment.

According to the technique described in Patent Literature 2, the gas barrier layer is necessary to prevent deterioration of the transparent conductive layer.

In view of such circumstances, the present invention provides a transparent conductive film having high durability in a high temperature and high humidity environment, even with no presence of a gas barrier layer near the transparent conductive film. The present invention also provides a method advantageous in producing such a transparent conductive film.

Solution to Problem

The present invention provides a transparent conductive film including a polycrystal, wherein
the polycrystal has grains having an average value of a maximum Feret diameter of 160 to 400 nm.
Also, the present invention provides a laminate including:
a substrate; and
the above transparent conductive film disposed on the substrate.
Further, the present invention provides a method for producing a transparent conductive film, the method including:
forming a film on a substrate by sputtering; and
annealing the film to form a transparent conductive film,
wherein
a pressure of an inert gas is adjusted to 0.4 Pa or less in the sputtering.

Advantageous Effects of Invention

The above transparent conductive film has high durability in a high temperature and high humidity environment, even with no presence of a gas barrier layer near the transparent conductive film. The above method is advantageous in producing the above transparent conductive film.

DESCRIPTION OF EMBODIMENTS

If the durability of a transparent conductive film in a high temperature and high humidity environment can be enhanced even with no presence of a gas barrier layer near the transparent conductive film, the value of the transparent conductive film is further enhanced. For example, if such a transparent conductive film can be used in the fields of information terminals such as smartphones having a touch panel, heaters, etc., high-value-added products can be provided. For example, since in-vehicle devices are required to function appropriately even in a harsh environment, it is advantageous, in using the transparent conductive film in in-vehicle devices, that the transparent conductive film has durability even in a harsh environment. On the other hand, to enhance the durability of a transparent conductive film, it has been conventionally considered that a gas barrier layer needs to be provided near the transparent conductive film as in the technique described in Patent Literature 2. In view of this, the present inventors have repeatedly conducted intensive studies on a technique for enabling to enhance the durability of the transparent conductive film in a high temperature and high humidity environment even with no presence of a gas barrier layer near the transparent conductive film. As a result of much trial and error repeated, the present inventors have newly found it advantageous to include a predetermined polycrystal in a transparent conductive film in order to enhance the durability of the transparent conductive film in a high temperature and high humidity environment. Based on this new finding, the present inventors have finally completed the present invention.

Hereinafter, embodiments of the present invention will be described with reference to the drawings. Note that the following description is illustrative of the present invention, and the present invention is not limited to the following embodiments. Note that the term "transparent" as used herein typically refers to be transparent to visible light.

Figure 1:
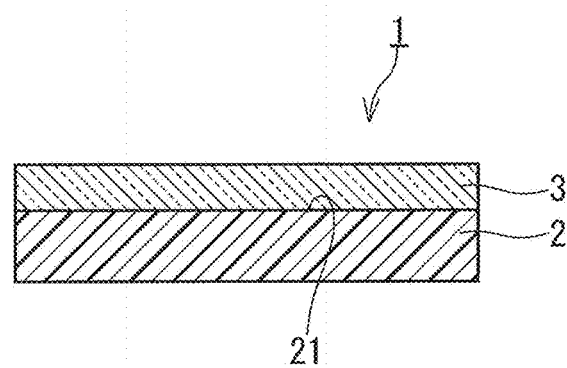
FIG. 1 is a cross-sectional view showing an example of the laminate according to the present invention.

As shown in FIG. 1, a laminate 1 includes a substrate 2 and a transparent conductive film 3. The transparent conductive film 3 is disposed on the substrate 2. In this way, the transparent conductive film 3 is provided typically in a state of being disposed on the substrate 2.

Figure 2:
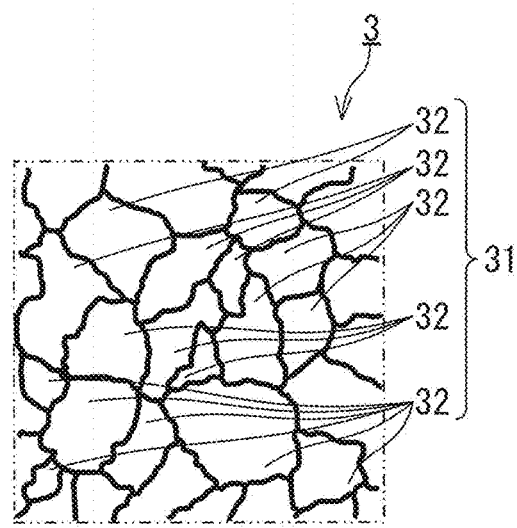
FIG. 2 is a diagram schematically showing a structure of a film surface of a transparent conductive film shown in FIG. 1.

As shown in FIG. 2, the transparent conductive film 3 includes a polycrystal 31. The polycrystal 31 has grains 32. An average value Df of the maximum Feret diameter of the grains 32 is 160 to 400 nm. Owing to the average value Df being 160 nm or more, water vapor is less likely to transmit through the transparent conductive film 3, and the transparent conductive film 3 can exhibit high durability in a high temperature and high humidity environment even with no presence of a gas barrier layer near the transparent conductive film 3. In addition, owing to the average value Df being 400 nm or less, cracking is less likely to occur in the transparent conductive film 3 even when the transparent conductive film 3 is subjected to a bending stress. This allows the transparent conductive film 3 to exhibit high durability in a high temperature and high humidity environment. The average value Df can be determined, for example, in accordance with a method including the following Steps (I), (II), and (III).

(I) In 10 or more visual fields of 400 nm square selected randomly from a TEM photograph of a film surface of the transparent conductive film 3, boundaries between the grains 32 are determined based on for example the contrast difference between images of the adjacent grains 32.

(II) Based on the boundaries determined in Step (I), the maximum Feret diameter of each of the grains 32 included in each of the visual fields is determined. This determination is performed on the grains 32 that are entirely visible in each of the visual fields.

(III) By calculating the arithmetic average of the maximum Feret diameters of the grains 32 determined in Step (II), the average value Df of the maximum Feret diameter of the grains 32 is determined.

A predetermined durability test is performed on the transparent conductive film 3. In this case, a sheet resistance Rp [Ω/□] of the transparent conductive film 3 after the durability test and a sheet resistance Rb [Ω/□] of the transparent conductive film 3 before the durability test, for example, satisfy a relationship of |Rp−Rb|/Rb≤5%. In other words, the rate of change in sheet resistance of the transparent conductive film 3 between before and after the durability test is for example 5% or less. The durability test is performed, for example, by keeping the environment of the transparent conductive film 3 under conditions at a temperature of 85° C. and a relative humidity of 85% for 1000 hours. The sheet resistance of the transparent conductive film 3 is less likely to change in a high temperature and high humidity environment, and thus the transparent conductive film 3 can exhibit high durability in a high temperature and high humidity environment. Note that the conditions for the environment of the transparent conductive film 3 in the durability test are just an example. The relationship of |Rp−Rb|/Rb≤5% can be satisfied even in the case for example where the durability test is performed on the transparent conductive film 3 under other conditions usually required in the fields of information terminals such as smartphones having a touch panel, in-vehicle devices such as heaters, etc. For example, according to the transparent conductive film 3, the relationship of |Rp−Rb|/Rb≤5% can be satisfied even when the durability test is performed in any of a high temperature and low humidity environment, a low temperature and high humidity environment, and a low temperature and low humidity environment.

The average value Df may be 170 nm or more, 180 nm or more, 190 nm or more, or 200 nm or more. The average value Df may be 350 nm or less, 330 nm or less, 300 nm or less, 280 nm or less, or 250 nm or less.

The transparent conductive film 3, for example, keeps the water vapor transmission rate Ws of a predetermined laminate to 0.0010 to 0.0250 g/(m²·24 hours) as determined according to ISO 15106-5: 2015. The predetermined laminate is a laminate in which the transparent conductive film 3 is disposed on a support member. In addition, the support member has a water vapor transmission rate of 1 g/(m²·24 hours) or more as determined according to ISO 15106-5: 2015. In this case, the transparent conductive film 3 can keep low the water vapor transmission rate of the laminate, which is prepared by disposing the transparent conductive film 3 on the support member having a high water vapor transmission rate. Accordingly, even with no presence of a gas barrier layer near the transparent conductive film 3, the transparent conductive film 3 can more reliably exhibit high durability in a high temperature and high humidity environment. Note that this laminate is prepared for convenience in order to indirectly evaluate the water vapor transmission rate of the transparent conductive film 3. Preparation of the laminate 1 does not mean that the above support member with the transparent conductive film 3 formed thereon is superposed on the substrate 2. In preparing the laminate 1, it is typical that only the transparent conductive film 3 is formed on the substrate 2. The support member of this laminate may be the same as or different from the substrate 2 of the laminate 1. In other words, the value of the water vapor transmission rate of the substrate 2 as determined according to ISO 15106-5: 2015 is not limited to the range of 1 g/(m²·24 hours) or more. The value of the water vapor transmission rate of the substrate 2 may be less than 1 g/(m²·24 hours). In this laminate, the support member occupies a space different from the transparent conductive film 3, and is definitely distinguished from the transparent conductive film 3.

The transparent conductive film 3 keeps the water vapor transmission rate Ws desirably to 0.0010 to 0.0200 g/(m²·24 hours), more desirably to 0.0010 to 0.0150 g/(m²·24 hours), and still more desirably to 0.0010 to 0.0120 g/(m²·24 hours). The water vapor transmission rate Ws may be 0.005 g/(m²·24 hours) or more, or 0.008 g/(m²·24 hours) or more.

The material of the polycrystal 31 in the transparent conductive film 3 is not particularly limited. The polycrystal 31 includes for example indium oxide. This allows the transparent conductive film 3 to more reliably exhibit high durability in a high temperature and high humidity environment.

In the transparent conductive film 3, the polycrystal 31 desirably includes indium oxide as a main component. This is advantageous from the viewpoint that the transparent conductive film 3 exhibits high durability in a high temperature and high humidity environment. The term "main component" as used herein refers to a component whose content on the mass basis is the highest.

In the transparent conductive film 3, the polycrystal 31 desirably includes indium tin oxide (ITO). This allows the transparent conductive film 3 to more reliably exhibit high durability in a high temperature and high humidity environment. The content of tin oxide in the ITO is for example 3 to 14 weight %, and is desirably 5 to 13 weight %.

A density d of the transparent conductive film 3 is not limited to a specific value. The density d is for example 7.15 g/cm³ or more. In this case, the grains 32 in the polycrystal 31 are likely to have small gaps therebetween. As a result, water vapor is less likely to transmit through the transparent conductive film 3, and thus the transparent conductive film 3 can more reliably exhibit high durability in a high temperature and high humidity environment.

The density d may be 7.20 g/cm³ or more, or 7.30 g/cm³ or more. The density d is for example 7.50 g/cm³ or less. Accordingly, cracking is less likely to occur in the transparent conductive film 3, and thus the transparent conductive film 3 can more reliably exhibit high durability in a high temperature and high humidity environment. The density d may be 7.40 g/cm³ or less.

A thickness t of the transparent conductive film 3 is not limited to a specific value. The thickness t is for example 20 to 150 nm. Owing to the thickness t being 20 nm or more, the transparent conductive film 3 is likely to have a desired sheet resistance. On the other hand, owing to the thickness t being 150 nm or less, cracking is less likely to occur in the transparent conductive film 3, and thus the transparent conductive film 3 can more reliably exhibit high durability in a high temperature and high humidity environment.

The thickness t may be 25 nm or more, 35 nm or more, or 45 nm or more. The thickness t may be 140 nm or less, 130 nm or less, or 120 nm or less.

An internal stress Pi of the transparent conductive film as determined by an X-ray stress measuring method is not limited to a specific value. The internal stress Pi is for example 150 to 1000 MPa. Owing to the internal stress Pi being 100 MPa or more, the grains 32 in the polycrystal 31 are likely to have small gaps therebetween. As a result, water vapor is less likely to transmit through the transparent conductive film 3, and thus the transparent conductive film 3 can more reliably exhibit high durability in a high temperature and high humidity environment. On the other hand, owing to the internal stress Pi being 1000 MPa or less, cracking is less likely to occur in the transparent conductive film 3, and thus the transparent conductive film 3 can more reliably exhibit high durability in a high temperature and high humidity environment. The internal stress Pi can be measured, for example, according to a method described in Examples.

The internal stress Pi may be 160 MPa or more, 180 MPa or more, 200 MPa or more, or 300 MPa or more. The internal stress Pi may be 950 MPa or less, 900 MPa or less, or 800 MPa or less.

In the laminate 1, the substrate 2 is not limited to a specific substrate. In particular, a water vapor transmission rate Wk of the substrate 2 as determined according to ISO 15106-5: 2015 is not limited to a specific value. The water vapor transmission rate Wk is for example 1 g/(m²·24 hours) or more. The water vapor transmission rate Wk may be less than 1 g/(m²·24 hours).

The substrate 2 is for example transparent to visible light. Accordingly, the laminate 1 can also be transparent to visible light. The laminate 1 may be transparent to light of a predetermined wavelength such as near infrared light.

The material of the substrate 2 is not limited to a specific material. The substrate 2 includes for example an organic material such as an organic polymer. Accordingly, the substrate 2 is likely to have flexibility. The substrate 2 may include for example at least one organic polymer selected from the group consisting of polyethylene terephthalates, polyethylene naphthalates, polyimides, polycarbonates, polyetheretherketones, and aromatic polyamides. The substrate 2 may include an inorganic material such as glass. In this case, the laminate 1 is likely to have high rigidity. The substrate 2 may be an organic-inorganic hybrid material, or may be a composite material.

For example, in the laminate 1, the substrate 2 and the transparent conductive film 3 are in contact with each other. A principal surface 21 of the substrate 2 defining an interface between the substrate 2 and the transparent conductive film 3 may be formed of a material having gas barrier properties, or may be formed of a material having no gas barrier properties.

A thickness T of the substrate 2 is not limited to a specific value. The thickness T is for example 10 μm to 2 mm from the viewpoint of favorable transparency, favorable strength, and ease of handling. The thickness T may be 20 μm or more, 30 μm or more, or 50 μm or more. The thickness T may be 1.8 mm or less, 1.5 mm or less, 1.0 mm or less, 500 μm or less, 300 μm or less, or 200 μm or less.

An example of a method for producing the transparent conductive film 3 will be described. The transparent conductive film 3 is produced, for example, by a method including the following Steps (i) and (ii).
(i) A film is formed on the substrate 2 by sputtering.
(ii) The film is annealed to form the transparent conductive film 3.

In the sputtering in Step (i), a pressure Pf of an inert gas is adjusted to 0.4 Pa or less. Conventionally, it has been considered that a low pressure of an inert gas in transparent conductive film formation by sputtering is disadvantageous because of increasing the internal stress of the transparent conductive film and thus causing substrate deformation. However, trial and error by the present inventors proved that adjustment of the pressure Pf to 0.4 Pa or less in sputtering for transparent conductive film formation is advantageous in order to produce a transparent conductive film exhibiting high durability in a high temperature and high humidity environment. It is considered that when the pressure Pf is adjusted to 0.4 Pa or less in sputtering for transparent conductive film formation, ion particles collide with the substrate 2 while maintaining a high energy state. This is considered to allow the average value Df of the maximum Feret diameter of the grains 32 to be easily adjusted to a range of 160 to 400 nm.

The pressure Pf may be 0.35 Pa or less, or 0.3 Pa or less. The pressure Pf is for example 0.05 Pa or more, and may be 0.07 Pa or more, or 0.1 Pa or more.

The method for the sputtering in Step (i) is not limited to a specific method. The method for the sputtering in Step (i) is for example a high magnetic field DC magnetron sputtering method. Accordingly, it is possible to more reliably produce the transparent conductive film 3 exhibiting high durability in a high temperature and high humidity environment.

The annealing in Step (ii) facilitates crystallization in the film formed in Step (i). As a result, the polycrystal 31 in a desired state can be obtained in the transparent conductive film 3.

An environmental temperature Tk of the substrate 2 in the annealing in Step (ii) is not limited to a specific value. The environmental temperature Tk is for example 165° C. or more. Accordingly, the substrate 2 is likely to shrink after the annealing, and thus the internal stress of the transparent conductive film 3 is likely to increase. As a result, it is possible to more reliably produce the transparent conductive film 3 exhibiting high durability in a high temperature and high humidity environment.

The environmental temperature Tk may be 170° C. or more, or 175° C. or more. The environmental temperature Tk is for example 185° C. or less. Accordingly, cracking is less likely to occur in the transparent conductive film 3.

A time Ha of the annealing in Step (ii) is not limited to a specific value. The time Ha is for example 90 minutes or less. The time Ha may be 60 minutes or less. The time Ha is for example 15 minutes or more. Accordingly, the polycrystal 31 in a desired state can be obtained in the transparent conductive film 3.

The transparent conductive film 3 may be formed not by sputtering but by a method such as vacuum deposition or ion plating.

Figure 3:
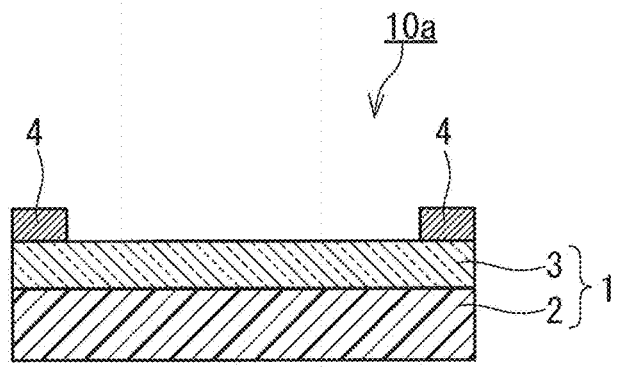
FIG. 3 is a cross-sectional view showing an example of a heater including the laminate according to the present invention.

The laminate 1 can be used, for example, in the fields of touch panels for information terminals, heaters, etc. For example, the laminate 1 can be used to provide a heater 10a shown in FIG. 3. The heater 10a includes the laminate 1 and a pair of power supply electrodes 4. The pair of power supply electrodes 4 are electrically connected to the transparent conductive film 3. The pair of power supply electrodes 4 can be connected to a power source (not shown). The pair of power supply electrodes 4 as used herein refer to a pair of a positive electrode and a negative electrode. When one of the pair of power supply electrodes 4 acts as a positive electrode, the other of the pair of power supply electrodes 4 acts as a negative electrode. Electric power from the power source is supplied to the transparent conductive film 3 by the pair of power supply electrodes 4, and thus the transparent conductive film 3 generates heat.

The power supply electrodes 4 have a thickness of, for example, 1 μm or more. Accordingly, the power supply electrodes 4 are less likely to be damaged when the heater 1a is operated at a high temperature rise rate. Note that the thickness of the power supply electrodes 4 is much larger than that of electrodes formed on a transparent conductive film used in display devices such as touch panels. The thickness of the power supply electrodes 4 may be 2 μm or more, 3 μm or more, or 5 μm or more. The thickness of the power supply electrodes 4 is for example 5 mm or less, and may be 1 mm or less, or 700 μm or less.

The pair of power supply electrodes 4 are formed in the following manner, for example. A seed layer is formed on a principal surface of the transparent conductive film 3 by a dry process such as chemical vapor deposition (CVD) or physical vapor deposition (PVD) or by plating. Next, a masking film is placed on portions of the seed layer where the power supply electrodes 4 are not to be formed. The masking film can be prepared by layering a resist on the seed layer and then performing exposure and development processes. Subsequently, a metal film having a thickness of 1 μm or more is formed on portions of the seed layer where the masking film is not placed, by a wet process such as plating. Next, the masking film placed on the seed layer is removed, and the metal film for forming the power supply electrodes 4 becomes covered with a masking film formed using a resist. Next, exposed portions of the seed layer are removed by etching. Subsequently, the masking film is removed, and the pair of power supply electrodes 4 thus can be formed.

The pair of power supply electrodes 4 may be formed in the following manner. First, a seed layer is formed on the principal surface of the transparent conductive film 3, as described above. Subsequently, a metal film having a thickness of 1 μm or more is formed on the principal surface of the transparent conductive film 3 by a dry process such as CVD or PVD or by a wet process such as plating. Next, portions of the metal film for forming the power supply electrodes 4 become covered with a masking film formed using a resist. Subsequently, unnecessary portions of the metal film are removed by etching, and the masking film is removed. The pair of power supply electrodes 4 are thus formed. Alternatively, the power supply electrodes 4 may be formed by applying a conductive ink onto the principal surface of the transparent conductive film 3 in a predetermined pattern and curing the applied conductive ink. The power supply electrodes 4 may be formed by applying a conductive paste onto the principal surface of the transparent conductive film 3 in a predetermined pattern by an application method such as application using a dispenser or screen printing, and curing the applied conductive paste. The conductive paste typically contains a filler of a conductive material such as silver. The power supply electrodes 4 may be formed using a solder paste.

The heater 10a can be modified in various respects. For example, the heater 10a may be modified so as to have a configuration of a heater 10b shown in FIG. 4. Unless otherwise described, the heater 10b is configured in a similar manner to the heater 10a. Components of the heater 10b that are the same as or correspond to those of the heater 10a are given the same reference numerals, and detailed descriptions thereof are omitted. The descriptions regarding the heater 10a also apply to the heater 10b, unless technically incompatible.

Figure 4:
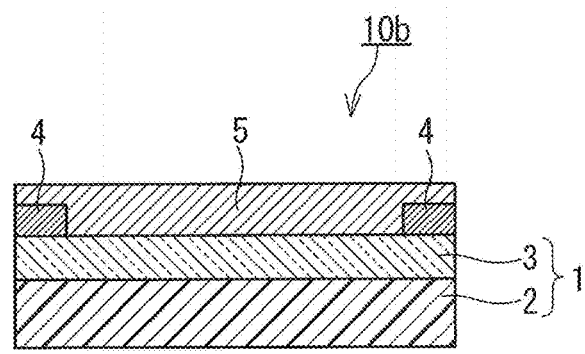
FIG. 4 is a cross-sectional view showing another example of the heater including the laminate according to the present invention.

As shown in FIG. 4, the heater 10b further includes a protective layer 5. The protective layer 5 is disposed such that the transparent conductive film 3 is positioned between the protective layer 5 and the substrate 2. For example, the protective layer 5 includes a predetermined protective film and a pressure-sensitive adhesive layer for attaching the protective film to the transparent conductive film 3. The transparent conductive film 3 is protected by the protective layer 5, and thus the heater 10b has high impact resistance. The material of the protective film included in the protective layer 5 is not particularly limited, and is for example a synthetic resin such as a fluororesin, silicone, an acrylic resin, or polyester. The thickness of the protective film is not limited to a specific value, and is for example 20 to 200 μm. This can prevent the heater 10b from having an excessively large thickness while the heater 10b has favorable impact resistance. The pressure-sensitive adhesive layer is formed of for example a known pressure-sensitive adhesive such as an acrylic pressure-sensitive adhesive. For example, in the case where the protective film itself has pressure-sensitive adhesiveness, the protective layer 5 may be formed only of the protective film.

Figure 5:
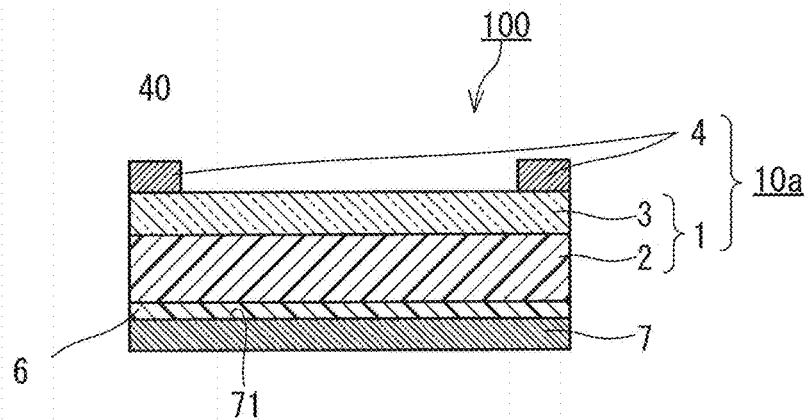
FIG. 5 is a cross-sectional view showing an example of a heater-equipped article including the heater shown in FIG. 3.

A heater-equipped article can be provided using the heater 10a or 10b. For example, as shown in FIG. 5, a heater-equipped article 100 includes a molded body 7, a pressure-sensitive adhesive layer 6, and the heater 10*a*. The molded body 7 has an adherend surface 71. The molded body 7 is formed of a metal material, glass, or a synthetic resin. The pressure-sensitive adhesive layer 6 is in contact with the adherend surface 71. The pressure-sensitive adhesive layer 6 is formed of for example a known pressure-sensitive adhesive such as an acrylic pressure-sensitive adhesive. The heater 10*a* is in contact with the pressure-sensitive adhesive layer 6 and is attached to the molded body 7 with the pressure-sensitive adhesive layer 6.

For example, the adhesive layer 6 may be formed beforehand on a principal surface of the substrate 2. In this case, the heater 10*a* can be attached to the molded body 7 by pressing the heater 10*a* against the molded body 7 in the state where the pressure-sensitive adhesive layer 6 and the adherend surface 71 face each other. Also, the pressure-sensitive adhesive layer 6 may be covered with a release sheet (not shown). In this case, when the heater 10*a* is attached to the molded body 7, the release sheet is peeled off to expose the pressure-sensitive adhesive layer 6. The release sheet 6 is for example a film formed of a polyester resin such as polyethylene terephthalate (PET).

For example, in an apparatus configured to perform processing using near-infrared light, the heater 10*a* is disposed on an optical path of this near-infrared light. This apparatus for example performs predetermined processing such as sensing or communication using near-infrared light. The molded body 7 for example configures a housing of such an apparatus.

EXAMPLES

Hereinafter, the present invention will be described in more detail by examples. The present invention is not limited to the following examples. First, evaluation methods and measurement methods used in the examples and comparative examples will be described.

[Determination of Average Value of Maximum Feret Diameter of Grains]

Laminates according to the examples and the comparative examples were each cut into a square of 300 μm square to obtain a piece. This piece was fixed to a sample holder of an ultramicrotome such that a film surface of the transparent conductive film faced an operator. A knife was placed such that its tip was positioned on a plane of the piece forming an extremely small acute angle (3° or less) with respect to the film surface of the transparent conductive film. Then, the piece was cut with the knife so as to have a thickness of 70 nm, and a section was thus obtained. The knife was placed such that a section having a target observation site of 3 μm square or more could be obtained.

With use of a transmission electron microscope JEM-2800 manufactured by JEOL Ltd., observation was performed on a film surface of a transparent conductive film in a sample for TEM observation prepared from the section. In 10 or more visual fields of 400 nm square selected randomly from a TEM photograph of this film surface, boundaries between grains were determined based on for example the contrast difference between images of adjacent grains. Then, based on the determined boundaries, the maximum Feret diameter of each of the grains included in each of the visual fields was determined. This determination was performed on grains that were entirely visible in each of the visual fields. By calculating the arithmetic average of the determined maximum Feret diameters of the grains, the average value Df of the maximum Feret diameter of the grains was determined. The results are shown in Table 1. In the determination of the average value Df of the maximum Feret diameter, values of the maximum Feret diameter of 10 or more grains were used.

[Measurement of Water Vapor Transmission Rate]

With use of a water vapor transmission rate measuring device DELTAPERM, measurement of the water vapor transmission rate was performed according to ISO 15106-5: 2015 on test specimens for water vapor transmission rate measurement prepared from the laminate according to the examples and the comparative examples. In this measurement, the environment of an upstream chamber was adjusted to a temperature of 40° C. and a relative humidity of 90%, and the pressure of the upstream chamber was adjusted to 50 Torr. In addition, in this measurement, the transparent conductive film abutted on a downstream chamber. In this measurement, when the pressure of the downstream chamber exceeded 1 Torr, a vacuum pump was operated for air exhaustion. The water vapor transmission rates determined from the results of this measurement are shown in Table 1. The water vapor transmission rates of substrates used in the examples and the comparative examples were measured in a similar manner to those of the laminates. The results are shown in Table 1.

[Measurement of Thickness of Transparent Conductive Film]

With use of an X-ray diffractometer (manufactured by Rigaku Corporation, product name: RINT2200), the thickness of the transparent conductive film was measured on the laminates according to the examples and the comparative examples by the X-ray reflectometry. The results are shown in Table 1.

[Density of Transparent Conductive Film]

The density of the transparent conductive film was measured on the laminates according to the examples and the comparative examples by the X-ray reflectometry. The results are shown in Table 1.

[Internal Stress of Transparent Conductive Film]

With use of an X-ray diffractometer (manufactured by Rigaku Corporation, product name: RINT2200), a sample was irradiated with Cu-Kα X-rays (wavelength λ: 0.1541 nm) that had been emitted from a light source of 40 kV and 40 mA and had been transmitted through a parallel beam optical system. The internal stress (compressive stress) of the transparent conductive film was evaluated by the principle of the $\sin^2\psi$ method. The $\sin^2\psi$ method is a method for determining the internal stress of polycrystalline thin films from the dependence of crystal lattice strain of the thin films on angles ($\psi$). With use of the above X-ray diffractometer, the diffraction intensity was measured at intervals of 0.02° in a range of 2θ=29.8° to 31.2° by θ/2θ scan measurement. The integration time at each measurement point was set to 100 seconds. From the peak angle 2θ of the obtained X-ray diffraction (the peak of the (222) plane of ITO) and the wavelength λ of the X-rays irradiated from the light source, a spacing of lattice planes d of an ITO crystal at each measurement angle ($\psi$) was calculated. From the spacing of lattice planes d, a crystal lattice strain ε was calculated by relationships of the following Equations (1) and (2), where λ represents the wavelength of the X-rays (Cu-Kα X-rays) irradiated from the light source and λ=0.1541 nm, and $d_0$ represents a spacing of lattice planes of ITO under an unstressed state and $d_0$=0.2910 nm. The value of do is the value described in the database of the International Center for Diffraction Data (ICDD).

$$2d \sin \theta = \lambda \qquad \text{Equation (1)}$$

$$\varepsilon = (d-d_0)/d_0 \qquad \text{Equation (2)}$$

Figure 6:
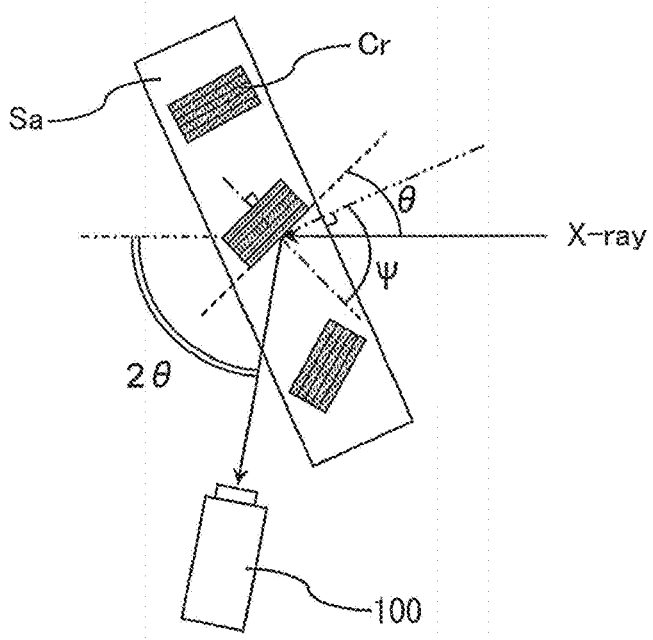
FIG. 6 is a diagram conceptually describing a method for measuring the internal stress of a transparent conductive film.

As shown in FIG. 6, the above X-ray diffraction measurement was performed for each of the cases where the angle ($\psi$) formed between the normal to a principal surface of a sample Sa of the transparent conductive film and the normal to a crystal plane of an ITO crystal Cr was 45°, 52°, 60°, 70°, and 90°. The crystal lattice strain ε at each angle (ψ) was thus calculated. Then, from a slope of a straight line in which a relationship between $\sin^2\psi$ and the crystal lattice strain ε was plotted, a residual stress (internal stress) σ in the in-plane direction of the transparent conductive film was determined by the following Equation (3). The results are shown in Table 1.

$$\varepsilon = \{(1+v)/E\}\sigma \sin^2\psi - (2v/E)\sigma \qquad \text{Equation (3)}$$

In Equation (3) above, E represents the Young's modulus (116 GPa) of ITO, and v represents the Poisson's ratio (0.35) of ITO. These values are described in D. G. Neerinck and T. J. Vink, "Depth Profiling of thin ITO films by grazing incidence X-ray diffraction", Thin Solid Films, 278 (1996), pp. 12-17. In FIG. 6, a sensor 100 senses X-ray diffraction.

[Durability Test]

A durability test was performed on a test specimen prepared from the laminate according to each of the examples and the comparative examples. In the durability test, the test specimens were placed in an environment at a temperature of 85° C. and a relative humidity of 85% for 1000 hours. With use of a non-contact type resistance measurement instrument (manufactured by Napson Corporation, product name: NC-80MAP), the sheet resistance of the transparent conductive film of the test specimen was measured before and after the durability test by an eddy current measurement method according to JIS Z 2316-1: 2014. From the measurement results, the value of |Rp−Rb|/Rb was determined for each test specimen, where Rp represents the value of the sheet resistance of the transparent conductive film after the durability test, and Rb represents the value of the sheet resistance of the transparent conductive film before the durability test. Test specimens satisfying |Rp−Rb|/Rb≤5% were evaluated as "A", and other test specimens were evaluated as "X". The results are shown in Table 1.

Example 1

Figure 7A:
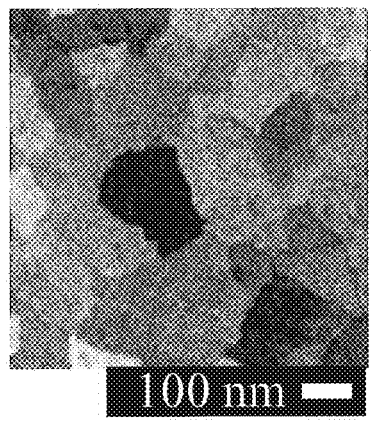
FIG. 7A is a transmission electron microscope (TEM) photograph of a film surface of a transparent conductive film according to Example 1.
Figure 7B:
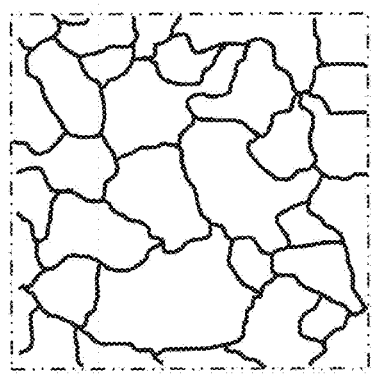
FIG. 7B is a diagram showing boundaries between grains in the photograph shown in FIG. 7A.

With use of indium tin oxide (ITO) (content of tin oxide: 10 weight %) as a target material, an ITO film was formed on a polyethylene naphthalate (PEN) film having a thickness of 125 μm by a DC magnetron sputtering method while an inert gas was present. Argon gas was used as the inert gas, and the pressure of the argon gas was adjusted to 0.2 Pa. The PEN film with the ITO film formed thereon was placed in air at 180° C. for 1 hour to undergo an annealing process. ITO was thus crystallized to form a transparent conductive film. In this manner, the laminate according to Example 1 was obtained. Conditions for the DC magnetron sputtering method were adjusted such that the transparent conductive film had a thickness of 50 nm. FIG. 7A shows a TEM photograph of a film surface of the transparent conductive film of the laminate according to Example 1. FIG. 7B shows boundaries between grains determined based on FIG. 7A.

Example 2

The laminate according to Example 2 was obtained in a similar manner to that in Example 1, except that the conditions for the DC magnetron sputtering method were adjusted such that the transparent conductive film had a thickness of 100 nm.

Example 3

The laminate according to Example 3 was obtained in a similar manner to that in Example 1, except that a polyethylene terephthalate (PET) film having a thickness of 125 μm was used instead of a PEN film.

Example 4

The laminate according to Example 4 was obtained in a similar manner to that in Example 1, except that a PET film having a thickness of 125 μm was used instead of a PEN film and the conditions for the annealing process were changed to conditions in air at 160° C. for 1 hour.

Example 5

The laminate according to Example 5 was obtained in a similar manner to that in Example 1, except that the conditions for the DC magnetron sputtering method were adjusted such that the transparent conductive film had a thickness of 30 nm.

Comparative Example 1

Figure 8A:
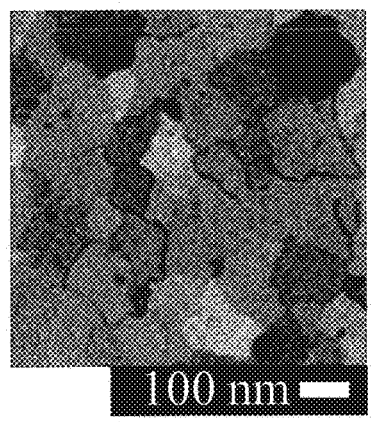
FIG. 8A is a TEM photograph of a film surface of a transparent conductive film according to Comparative Example 1.
Figure 8B:
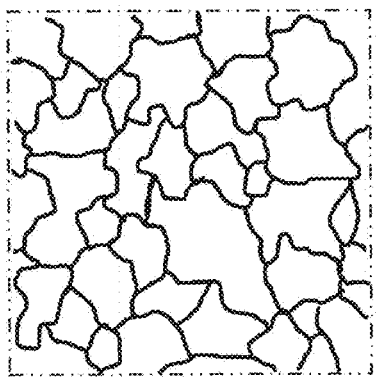
FIG. 8B is a diagram showing boundaries between grains in the photograph shown in FIG. 8A.

The laminate according to Comparative Example 1 was obtained in a similar manner to that in Example 1, except that the pressure of argon gas was changed to 0.45 Pa in the DC magnetron sputtering method and that the PEN film with the ITO film formed thereon was placed in air at 150° C. for 3 hours to undergo an annealing process. FIG. 8A shows a TEM photograph of a film surface of the transparent conductive film of the laminate according to Comparative Example 1. FIG. 8B shows boundaries between grains determined based on FIG. 8A.

Comparative Example 2

The laminate according to Comparative Example 2 was obtained in a similar manner to that in Comparative Example 1, except that the pressure of argon gas was changed to 1.0 Pa in the DC magnetron sputtering method.

Comparative Example 3

The laminate according to Comparative Example 3 was obtained in a similar manner to that in Comparative Example 1, except that no annealing process was performed. The transparent conductive film of the laminate according to Comparative Example 3 was amorphous.

As shown in Table 1, it was suggested that the transparent conductive films of the laminates according to Examples 1 to 5 had a low rate of change in sheet resistance between before and after the durability test, and exhibited favorable durability in a high temperature and high humidity environment. In contrast, the transparent conductive films of the laminates according to Comparative Examples 1 to 3 had a high rate of change in sheet resistance between before and after the durability test, and it was difficult to say that the durability in a high temperature and high humidity environment was favorable. In the transparent conductive films of the laminates according to Examples 1 to 5, the average value of the maximum Feret diameter of the grains fell within the range of 160 to 400 nm. This was suggested to be advantageous from the viewpoint of durability in a high temperature and high humidity environment.

As shown in Table 1, the internal stresses of the transparent conductive films of the laminates according to Examples 1, 2 and 5 fell within a range of 100 to 500 MPa. In contrast, the internal stresses of the transparent conductive films of the laminates according to Examples 3 and 4 were larger than the internal stresses of the transparent conductive films of the laminates according to Examples 1, 2 and 5. It was suggested that the use of a PET film as the substrate is likely to increase shrinkage after the annealing process and thus is likely to increase the internal stress of the transparent conductive film compared to the use of a PEN film as the substrate.

TABLE 1

| | Transparent conductive film | | | | | Substrate | | Laminate | |
|---|---|---|---|---|---|---|---|---|---|
| | Crystalline state | Average value of maximum Feret diameter of grains [nm] | Density [g/m³] | Thickness [nm] | Internal stress [MPa] | Type | Water vapor transmission rate [g/(m² · 24 hours)] | Water vapor transmission rate [g/(m² · 24 hours)] | Durability test |
| Example 1 | Polycrystalline | 215 | 7.30 | 50 | 323 | PEN | 1.90 | 0.0099 | A |
| Example 2 | Polycrystalline | 226 | 7.30 | 100 | 438 | PEN | 1.90 | 0.0082 | A |
| Example 3 | Polycrystalline | 310 | 7.35 | 50 | 894 | PET | 4.20 | 0.0185 | A |
| Example 4 | Polycrystalline | 310 | 7.30 | 50 | 613 | PET | 4.20 | 0.0198 | A |
| Example 5 | Polycrystalline | 170 | 7.30 | 30 | 189 | PEN | 1.90 | 0.0224 | A |
| Comparative Example 1 | Polycrystalline | 158 | 7.10 | 50 | 132 | PEN | 1.90 | 0.0251 | X |
| Comparative Example 2 | Polycrystalline | 73 | 7.00 | 50 | 77 | PEN | 1.90 | 0.0469 | X |
| Comparative Example 3 | Amorphous | — | 7.00 | 50 | 33 | PEN | 1.90 | 0.0640 | X |

The invention claimed is:

1. A laminate comprising:
  a supporting member; and
    a transparent conductive film comprising a polycrystal, the transparent conductive film being disposed on the supporting member, wherein
  the polycrystal has grains having an average value of a maximum Feret diameter of more than 200 nm and less than or equal to 400 nm,
  the polycrystal has a gain boundary extending among the grains in a net-like manner,
  a water vapor transmission rate of the laminate is 0.0010 to 0.0250 g/(m²·24 hours), the water vapor transmission rate being determined according to ISO 15106-5: 2015, and
  the support member has a water vapor transmission rate of 1 g/(m²·24 hours) or more as determined according to ISO 15106-5: 2015.

2. The laminate according to claim 1, wherein the polycrystal includes indium oxide.

3. The laminate according to claim 1, having a density of 7.15 g/cm3 or more.

4. The laminate according to claim 1, having a thickness of 20 to 150 nm.

5. The laminate according to claim 1, having an internal stress of 150 to 1000 MPa as determined by an X-ray stress measuring method.

* * * * *